United States Patent [19]
Baer et al.

[11] Patent Number: 5,427,848
[45] Date of Patent: Jun. 27, 1995

[54] STRESS BALANCED COMPOSITE LAMINATE MATERIAL

[75] Inventors: Luther J. Baer, Conklin; Paul G. Rickerl, Endicott; Mark J. Schadt, Vestal, all of N.Y.

[73] Assignee: International Business Machines Corporation, Armonk, N.Y.

[21] Appl. No.: 992,196

[22] Filed: Dec. 17, 1992

Related U.S. Application Data

[60] Continuation-in-part of Ser. No. 902,951, Jun. 23, 1992, Pat. No. 5,306,741, which is a division of Ser. No. 695,850, May 6, 1991, Pat. No. 5,156,710.

[51] Int. Cl.$^6$ ............................................. B32B 15/08
[52] U.S. Cl. ................................. 428/332; 428/473.5; 427/520; 427/542; 427/521
[58] Field of Search ................. 428/473.5, 332; 427/55

[56] References Cited

U.S. PATENT DOCUMENTS

| | | | |
|---|---|---|---|
| 4,654,248 | 3/1987 | Mohammed | 428/137 |
| 4,675,246 | 1/1987 | Kundinger et al. | 428/473.5 |
| 4,792,476 | 12/1988 | Numata et al. | 428/209 |
| 4,916,009 | 4/1990 | Hino et al. | 428/220 |
| 4,931,310 | 6/1990 | Anschel et al. | 427/55 |
| 4,937,133 | 6/1990 | Watanabe et al. | 428/209 |
| 4,996,623 | 2/1991 | Erpelding et al. | 360/104 |

*Primary Examiner*—Paul J. Thibodeau
*Assistant Examiner*—David Abraham
*Attorney, Agent, or Firm*—Calfee, Halter & Griswold

[57] ABSTRACT

A composite laminated structure is provided which includes a thin copper or other conducting material laminated to a polyimide having a relatively high coefficient of thermal expansion which in turn is bonded to a polyimide which has a relatively low coefficient of thermal expansion (CTE). This polyimide is in turn bonded to a relatively thick base such as stainless steel. The thicknesses of the polyimide and copper and the specific coefficients of thermal expansion of all of the material are so selected that in the absence of support from the stainless steel the stresses between the various layers are balanced in such a way that the two layers of polyimide and the copper remain essentially flat. This allows for a stainless steel substrate to have a portion etched away or otherwise removed so as to form a hinge region; and when the stainless steel is removed, the remaining structure will remain essentially flat and not curl either toward the stainless steel or toward the copper. From this a desired bend angle can be formed in the resulting trilayer structure comprised of two polyimide layers and one copper layer.

3 Claims, 1 Drawing Sheet

STRESS BALANCED COMPOSITE LAMINATE MATERIAL

This is a continuation in part of application Ser. No. 07/902,951 filed Jun. 23, 1992, now U.S. Pat. No. 5,306,741 issued Apr. 26, 1994, which in turn is a division of application Ser. No. 07/695,850 filed May 6, 1991 which is now U.S. Pat. No. 5,156,710 issued Oct. 20, 1992.

FIELD OF THE INVENTION

This invention relates generally to stress balanced composite laminate materials, and more particularly to multi-layer polyimide copper laminated on a rigid stainless steel structure.

BACKGROUND OF THE INVENTION

The above entitled patent applications describes a method of laminating polyimide to thin sheet metal, such as copper and to a stainless steel substrate. As disclosed in the above-entitled patent applications, a composite laminate is made by providing a stainless steel substrate to which a solution of an intractable polyimide precursor is applied and then dried to form a tack-free film. Thereafter, a solution of the precursor of a thermoplastic polyimide is applied to the film of intractable polyimide precursor and dried to form a tack-free second film. Both the films are then cured concomitantly at a sufficiently rapid rate, preferably with IR radiation, to effect near complete imidization of the polyimide precursors of both films. Thereafter, a conducting metal sheet or foil, such as a beryllium copper or other copper alloy is laminated onto the thermoplastic polyimide film according to the process disclosed therein. This will provide a composite laminate material comprised of a relatively thick rigid stainless steel substrate, a layer of an intractable polyimide bonded thereto, a layer of thermoplastic polyimide bonded to the intractable polyimide, and a sheet of thin conducting material such as copper foil bonded to the thermoplastic polyimide. In the above noted patent application Ser. No. 07/695,850, the intractable polyimide is disclosed as being preferably poly(4,4'-oxydiphenylene benezene-1,2,4,5, tetracarboxylicdiimide) often referred to as PMDA-ODA of which Pyralin (a registered trademark of E.I. DuPont) 5878 manufactured by E.I. DuPont is an example and the thermoplastic polyimide layer as disclosed as being preferably poly(4,4'-oxydiphenylene 1,1'-hexafluoropropyldiphenylene 3,3', 4,4'-tetracarboximide) also often referred to as 6FPDA-ODA, of which Pyralin 2566 manufactured by E.I. DuPont is an example.

One of the uses of this laminate is in forming suspension arm assemblies in direct access storage devices (DASD's) such as the type shown in U.S. Pat. No. 4,996,623. In such applications it is typically required that the copper be etched to form circuit patterns and that the stainless steel be removed by etching at a given location across the strip in order to provide a hinge so that the composite can be bent to a given angle. In the formation of this hinge, the properties of both the polyimide layers and the copper layers are critical. For example, if the copper layer is too thick, the dynamic performance of the arm will suffer. Moreover, the polyimide layers must be sufficiently thin (i.e. a total thickness of less than about 10 $\mu$m) to allow the copper to control the properties of the hinge. It is desirable that the composite material remain flat after all of the etching has taken place so that when the bend angle for the hinge is formed, it can be accurately formed starting with a flat sheet of material. (The etching referred to includes both forming the circuit on the copper foil and removal of the stainless steel in the hinge region.) It has been found that the composite in fact does remain flat as long as the stainless steel backing material or substrate remains intact. However, it was found with the use of the materials and their thicknesses as disclosed in the above entitled patent application, when the stainless steel was etched to form a hinge, unbalanced residual stresses caused a bending of the composite material at the location where the stainless steel was removed, thereby rendering a curved rather than a flat material at the hinge location. Typically, curving would cause a configuration which was concave on the side of the stainless steel. It is believed that this bending or flexing is due to a combination of factors including different coefficients of thermal expansion (CTE) of the two polyimides themselves, between the polyimides and stainless steel, and between the polyimides and copper, resulting in an unbalanced thermal stress being created due to the heating and cooling during the laminating cycle. Briefly explained, it is believed that the stress develops because each of the polyimides has a CTE (36–45 ppm/° C.) which is greater than the CTE (17–20 ppm/° C.) of each the copper and stainless steel. During the curing processes and the lamination when these materials are heated they expand before the bonding takes place, but once the bonding has taken place and the materials cool there are unbalanced stresses which result principally at polyimide to polyimide and also the polyimide to copper foil interfaces. As long as the relatively thick stainless steel is tightly bonded to the intractable polyimide the thickness and rigidity of the stainless steel together with the nature and direction of the unbalanced forces prevent any appreciable flexure or strain as a result of the unbalanced stresses. However, once the stainless steel is removed by etching to form the hinge region, this solid relatively thick stainless steel backing is no longer available and due to the relatively thin films of the polyimide and the thin copper metal, the unbalanced stresses (especially at the copper-polyimide interface) result in a strain in the form of a flexure or curving of the composite at the area where the stainless steel has been removed.

While thicker polyimide coatings and thicker copper material could alleviate this condition to some extent, such increased thicknesses are not feasible because of performance requirements in suspension arms for DASD's as described above. Thus, there is a need to provide a composite material suitable for suspension arms for DASD wherein the hinge can be formed starting with a relatively flat composite even after the stainless steel substrate has been removed to form a hinge region.

SUMMARY OF THE INVENTION

According to the present invention a composite laminated structure is provided which includes a thin copper or other conducting material laminated to a polyimide having a relatively high coefficient of thermal expansion (CTE) which in turn is bonded to a polyimide which has a relatively low coefficient of thermal expansion (CTE). This polyimide with the low coefficient of thermal expansion is in turn bonded to a relatively thick base such as stainless steel. The thicknesses of the polyimide and copper and the specific coefficients of thermal expansion of all of the material are so selected that in the absence of support from the stainless steel the stresses between the various layers are balanced in such a way that the two layers of polyimide and the copper remain essentially flat. This allows for a stainless steel substrate to have a portion etched away or otherwise removed so as to form a hinge region; and when the stainless steel is removed, the remaining structure will remain essentially flat and not curl either toward the stainless steel or toward the copper. From this a desired bend angle can be formed in the resulting trilayer structure comprised of two polyimide layers and one copper layer. Further, the stainless steel is sufficiently thick that where the copper is etched to form a conducting or circuit pattern, the stainless steel will prevent the unbalanced stresses from causing a strain that would flex the resulting structure of the polyimide and the stainless steel due to the reduced amount of copper (from the circuit pattern-etching of the copper sheet).

DESCRIPTION OF THE PREFERRED EMBODIMENT

Figure 1:
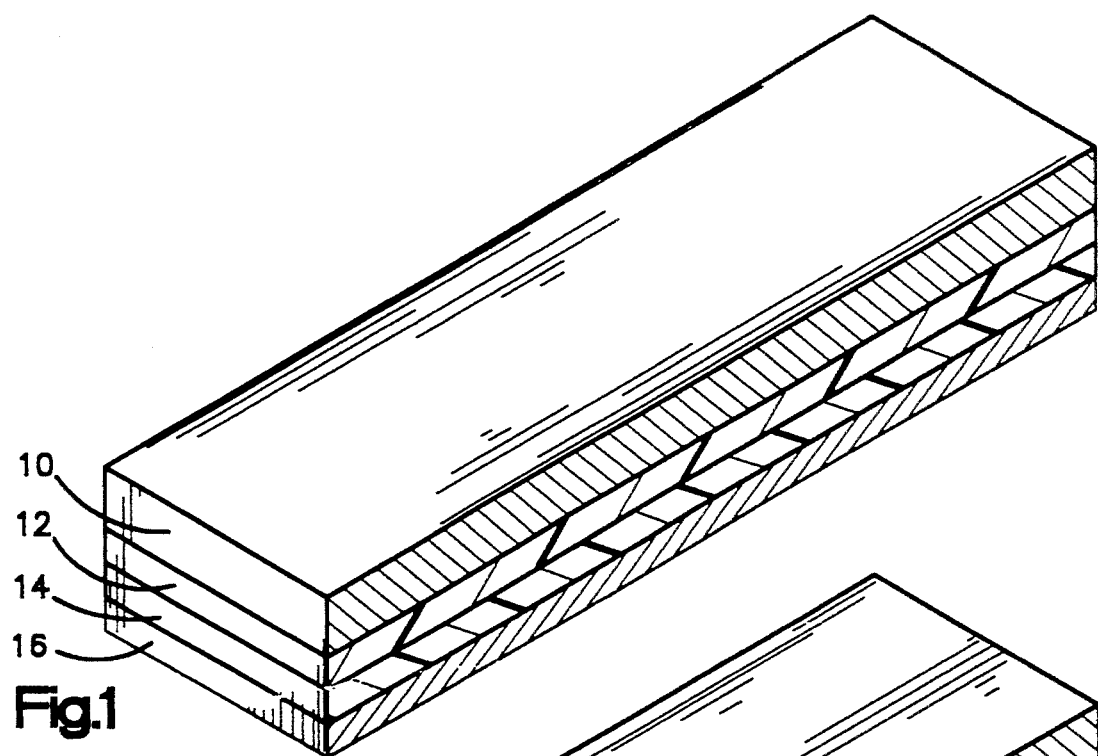
FIG. 1 is a perspective view, somewhat diagrammatic, of a composite structure formed according to this invention.

FIG. 1 shows a composite laminate structure according to the present invention which in the preferred embodiment is used for forming a suspension arm for DASD devices. From this structure shown in FIG. 1, a circuit pattern is etched in the copper and a hinge area formed so that the suspension arm for the DASD can be properly shaped and circuitized for performance in a DASD device. The drawings are somewhat diagrammatic in that the relative thickness of the materials are not drawn to scale. Moreover, the configurations of the etched circuit pattern and hinged region are representations and do not necessarily conform to the actual final structure, but are merely indicative of them generally. Closer representation of the actual structures are shown in said U.S. Pat. No. 4,996,623.

The composite laminate as shown in FIG. 1 includes a stainless steel substrate 10 which has bonded thereon an intractable polyimide 12 having a relatively low coefficient of thermal expansion (CTE). On top of the intractable polyimide 12 is a layer of thermoplastic polyimide 14 which has a relatively high coefficient of thermal expansion and on top of the thermoplastic polyimide 14 is a thin sheet of copper 16 or other conducting metal which has a coefficient of thermal expansion substantially lower than that of the thermoplastic polyimide 14 and substantially higher than that of the intractable polyimide 12. While there are many different methods of forming the composite layer of stainless steel-polyimide-copper the preferred method is that shown and described in the above entitled patent application Ser. No. 07/902,951 of which this is a continuation-in-part and which is incorporated herein by reference.

Preferably the stainless steel substrate 10 is relatively thick (e.g. 50–102 microns thick), and preferably is a 300 series stainless steel such as Type 302 or Type 304 having a CTE of about 17–20 ppm/° C. in the temperature range of 0°–100° C. Preferably the intractable polyimide 12 is poly(4-4'-oxydiphenylene biphenyl tetracarboximide) and is sometimes referred to as BPDA-PDA and preferably is between about 3.0 to about 6.0 µm thick. This has a coefficient of thermal expansion (CTE) of about 5–8 ppm/° C. The thermoplastic polyimide preferably is about 1.5 to 4 µm thick and preferably is 6FPDA-ODA which below its $T_g$ has a CTE of approximately 35–40 ppm/° C. The copper is preferably about 12 to 18 microns thick. A beryllium copper alloy, such as Alloy 3 which is sold by Brush-Wellman, having a place of business at 17876 St. Clair Avenue, Cleveland, Ohio 44110 is the preferred material. Thus, a composite laminate structure is provided which has a stainless steel substrate 50–102 microns thick having a CTE of about 17–20 ppm/° C., an intractable polyimide between 3 and 6 µm thick having a CTE of about 5–8 ppm/° C., a thermoplastic between 1.5 and 4 microns having a CTE of about 35–40 ppm/° C., and a sheet of copper alloy foil equal to or less than about 36 microns thick, preferably between 12 and 18 microns thick having a CTE of about 17 ppm/° C. The total thickness of the two polyimide layers 12, 14 should not exceed about 10 µm. The ratio of thickness of the intractable polyimide 12 to the thermoplastic polyimide 14 should be between about 1.1 and about 1.75:1, preferably between about 1.3:1 and 1.75:1 and even more preferably between 1.5:1 and 1.67:1.

Figure 2:
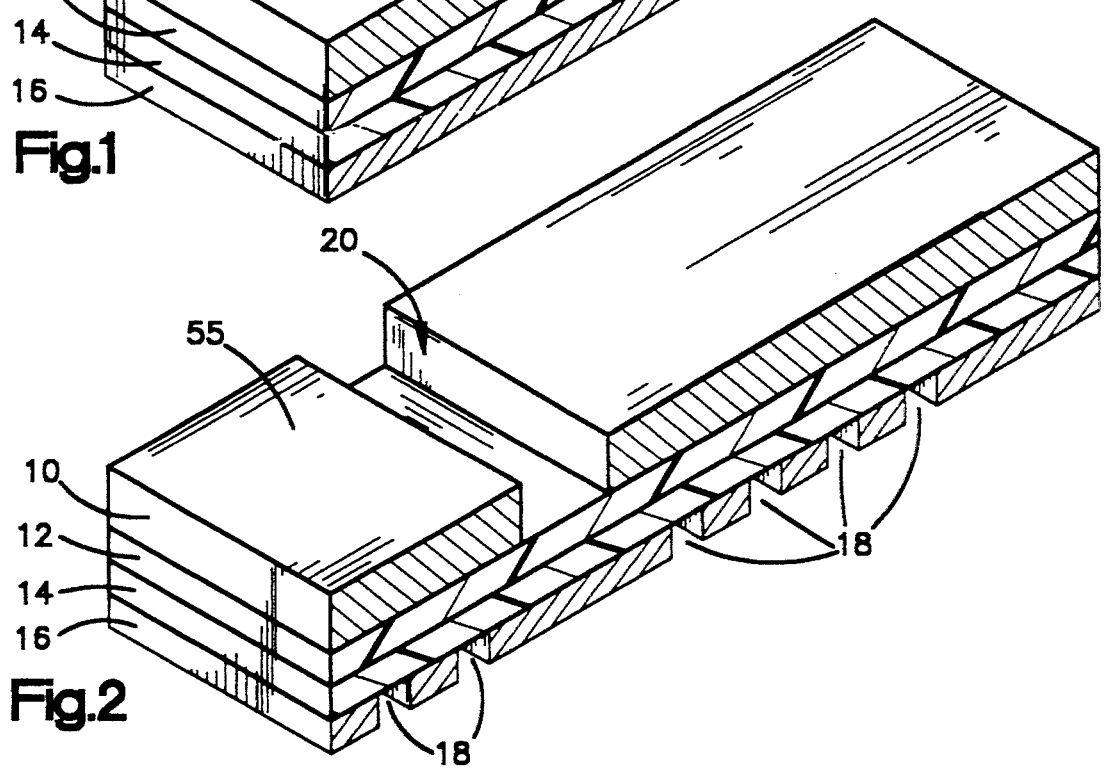
FIG. 2 is a perspective view, somewhat diagrammatic, of a structure similar to that of FIG. 1 but with circuit lines etched therein and portion of the substrate removed to form a hinge area.
Figure 3:
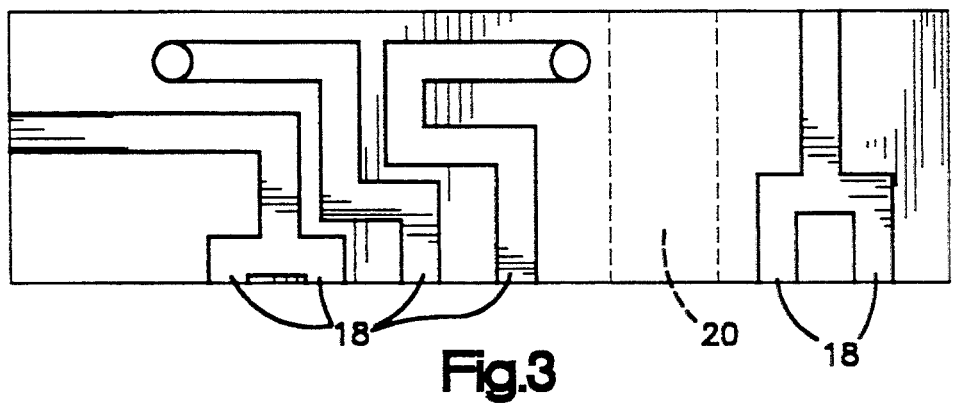
FIG. 3 is a plan view, somewhat diagrammatic, of the structure with a circuit pattern etched on the copper.

To form a suspension, the structure as shown in FIG. 1 has a section of the stainless steel 10 removed by etching away to provide for a hinge region 20 thereby exposing the layers of intractable polyimide 12, the thermoplastic polyimide 14 and copper 16. However, the net sum or resultant of the thermal stresses arising from the remaining layers is essentially zero. As such, the composite structure remains essentially flat even with a portion of the stainless steel removed to define the hinge area 20 and even with all three of the layers (i.e. two polyimide layers and one copper layer) being thin and very flexible. The resulting structure can be etched to form a circuit pattern 18 as shown in FIG. 2 (either before, after or while concurrently etching the hinge region) provided that a substantial amount of copper remains opposite the hinge area 20. However, significant and substantial amounts of copper can be removed to etch the pattern 18 in those areas remote from the hinge region 20 since the stainless steel 10 provides a relatively rigid support structure therebeneath and no flexing or bending of the composite material will take place even with the unbalanced stresses between the two layers of polyimide and the stainless steel.

Table 1 below shows comparison results of varying thicknesses of the two layers of polyimide forming a structure in which the stainless steel has been etched to form a hinge area according to this invention.

TABLE 1

Effect of varying polyimide layer thickness ratio on deflection. All results are following wet etch removal of stainless steel from the entire surface of a 3 × 8 inch part.

| BPDA-PDA(μm) | 6FPDA-ODA(μm) | Total Polyimide Thickness (μm) | Ratio | Deflection |
|---|---|---|---|---|
| 2.0 | 2.3 | 4.3 | 0.9:1 | to SS |
| 3.5 | 4.4 | 7.9 | .8:1 | to SS |
| 3.0 | 5.0 | 8.0 | .6:1 | to SS |
| 2.5 | 4.2 | 6.7 | .6:1 | to SS |
| 3.0 | 3.8 | 6.8 | .8:1 | to SS |
| 4.0 | 4.0 | 8.0 | 1:1 | to SS |
| 3.5 | 3.5 | 7.0 | 1:1 | to SS |
| 2.5 | 2.5 | 5.0 | 1:1 | to SS |
| 3.0 | 3.0 | 6.0 | 1:1 | to SS |
| 3.0 | 2.3 | 5.3 | 1.3:1 | to SS (slight) |
| 3.0 | 2.0 | 5.0 | 1.5:1 | Flat |
| 2.5 | 1.5 | 4.0 | 1.67:1 | Flat |
| 3.5 | 2.0 | 5.5 | 1.75:1 | to Cu (slight) |
| 3.5 | 1.5 | 5.0 | 2.33:1 | to Cu |

Because the magnitude of the overall net stress in the laminate is a function of the cross-sectional thickness, as well as the CTE, of each contributing layer, the net stress can be adjusted to give a zero strain by varying the thickness ratio of the polyimide layers. The preferred thicknesses and ratios are given above. In such a way an essentially flat laminate can be obtained even where the stainless steel has been removed.

It is to be understood that the CTE's and the thicknesses illustrated and described can vary somewhat with different processing variables. For example, both the CTE's and the thicknesses can be modified by varying the solvent or solvents used for the polyimide precursor systems and by varying the conditions under which the polyimides are cured.

While the present invention has been shown and described various adaptations and modifications can be made without departing from the scope of the invention as defined in the appended claims.

What is claimed is:

1. A composite laminate comprising:
   a first layer of polyimide having a relatively high coefficient of thermal expansion;
   a second layer of polyimide having a relatively low coefficient of thermal expansion bonded to the first layer of polyimide;
   a layer of a conductive material having a coefficient of thermal expansion between that of the two polyimides, bonded to said first layer of polyimide;
   said second layer of polyimide being bonded to a stainless steel substrate, said stainless steel substrate having a portion thereof removed to provide a hinge area;
   the thickness of said conductive material being no greater than about 36 microns, the total thickness of the two polyimide layers being less than about 10 microns, the ratio of thickness of the second layer of polyimide to the first layer of polyimide being between about 1 to 1 and about 1.75 to 1;
   said composite being further characterized by having the net of the unbalanced stresses between the layers of materials sufficiently low to provide an essentially flat, uncurved composite material.

2. The composite laminate as defined in claim 1 wherein the first layer of polyimide is an intractable polyimide and the second layer of polyimide is a thermoplastic polyimide.

3. The invention as defined in claim 1 further characterized by said first layer of polyimide being poly(4,4'-oxydiphenylene 1,1'-hexafluoropropyldiphenylene 3,3', 4,4'-tetracarboximide) and said second layer of polyimide being poly(4-4'-oxydiphenylene biphenyl tetracarboximide).

* * * * *